(12) United States Patent
Cheng et al.

(10) Patent No.: US 12,308,075 B2
(45) Date of Patent: May 20, 2025

(54) OPERATION METHOD FOR A MEMORY DEVICE

(71) Applicant: MACRONIX INTERNATIONAL CO., LTD., Hsinchu (TW)

(72) Inventors: Chih-Chieh Cheng, Zhubei (TW); Chun-Chang Lu, Yunlin County (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 132 days.

(21) Appl. No.: 18/163,346

(22) Filed: Feb. 2, 2023

(65) Prior Publication Data

US 2023/0178156 A1    Jun. 8, 2023

Related U.S. Application Data

(62) Division of application No. 17/249,178, filed on Feb. 23, 2021, now Pat. No. 11,600,339.

(51) Int. Cl.
| | |
|---|---|
| *G11C 16/28* | (2006.01) |
| *G11C 16/08* | (2006.01) |
| *G11C 16/10* | (2006.01) |
| *G11C 16/30* | (2006.01) |
| *G11C 16/34* | (2006.01) |

(52) U.S. Cl.
CPC .............. *G11C 16/28* (2013.01); *G11C 16/08* (2013.01); *G11C 16/10* (2013.01); *G11C 16/30* (2013.01); *G11C 16/3404* (2013.01)

(58) Field of Classification Search
CPC ......... G11C 16/28; G11C 16/08; G11C 16/10; G11C 16/30; G11C 16/3404
See application file for complete search history.

(56) References Cited

U.S. PATENT DOCUMENTS

| | | | |
|---|---|---|---|
| 4,907,200 A * | 3/1990 | Ikawa ............... | G11C 11/4094 365/210.11 |
| 8,432,741 B2 | 4/2013 | Lee | |
| 9,286,994 B1 | 3/2016 | Chen | |
| 9,928,889 B1 * | 3/2018 | Narasimhan ........ | G11C 7/1075 |
| 10,121,542 B2 | 11/2018 | Nam | |
| 10,269,438 B2 | 4/2019 | Cho | |
| 10,790,024 B2 | 9/2020 | Joo et al. | |
| 2012/0307561 A1 | 12/2012 | Joo et al. | |

\* cited by examiner

*Primary Examiner* — Son L Mai
(74) *Attorney, Agent, or Firm* — McClure, Qualey & Rodack, LLP

(57) ABSTRACT

An operation method for a memory device is provided. The operation method includes: increasing a dummy word line voltage to a first dummy word line voltage during a pre-turn on period; increasing the dummy word line voltage from the first dummy word line voltage to a second dummy word line voltage during a read period; and lowering the dummy word line voltage after the read period is finished. Wherein the first dummy word line voltage is lower than the second dummy word line voltage.

8 Claims, 11 Drawing Sheets

OPERATION METHOD FOR A MEMORY DEVICE

This application is a division of U.S. application Ser. No. 17/249,178 (now allowed), filed on Feb. 23, 2021, the content of which is incorporated herein by reference.

TECHNICAL FIELD

The disclosure relates in general to an operation method for a memory device, and more particularly to a read operation method for a memory device.

BACKGROUND

For three-dimension (3D) memory devices, after heavy read cycles, e.g. 100K read cycles, some of dummy word lines (DWL) suffers read disturbance, especially for dummy word lines of unselected (de-select) sub-blocks.

Analysis reveals that when the pre-turn on period of the string select lines (SSLs) or the global select lines (GSLs) is closed, if the pass voltage (Vpass) of the unselected word lines is lower than the threshold voltages of the SSLs or GSLs, then the down-coupling effect occurs. This may cause large channel potential difference between the SSLs and the dummy word lines, or large channel potential difference between the GSLs and the dummy word lines; and has a high vertical electronic field at the dummy word lines. Hot carrier injection is likely to occur and then read disturbance occurs.

SUMMARY

According to one embodiment, an operation method for a memory device is provided. The operation method includes: increasing a dummy word line voltage to a first dummy word line voltage during a pre-turn on period; increasing the dummy word line voltage from the first dummy word line voltage to a second dummy word line voltage during a read period; and lowering the dummy word line voltage after the read period is finished. Wherein the first dummy word line voltage is lower than the second dummy word line voltage.

According to another embodiment, provided is an operation method for a memory device. The operation method includes: increasing a dummy word line voltage to a first dummy word line voltage during a pre-turn on period and lowering the dummy word line voltage when the pre-turn on period is finished; increasing the dummy word line voltage to a second dummy word line voltage; and lowering the dummy word line voltage after the read period is finished. Wherein the first dummy word line voltage is lower than the second dummy word line voltage. A rising edge where the dummy word line voltage is increased to the second dummy word line voltage is earlier than a rising edge of a selected word line voltage.

According to an alternative embodiment, provided is an operation method for a memory device. The operation method includes: increasing a string select line voltage of at least one unselected sub-block to a first string select line voltage during a pre-turn on period; lowering the string select line voltage of the at least one unselected sub-block from the first string select line voltage to a second string select line voltage when the pre-turn on period is finished, the first string select line voltage is higher than the second string select line voltage; and lowering the string select line voltage of the at least one unselected sub-block from the second string select line voltage.

Figure 1:
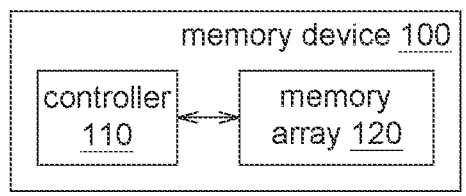
FIG. 1 shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory device according to one embodiment of the application. The memory device 100 includes: a controller 110 and a memory array 120. The controller 110 is coupled to the memory array 120. The controller 110 controls operations (for example the read operations) of the memory array 120.

Figure 2:
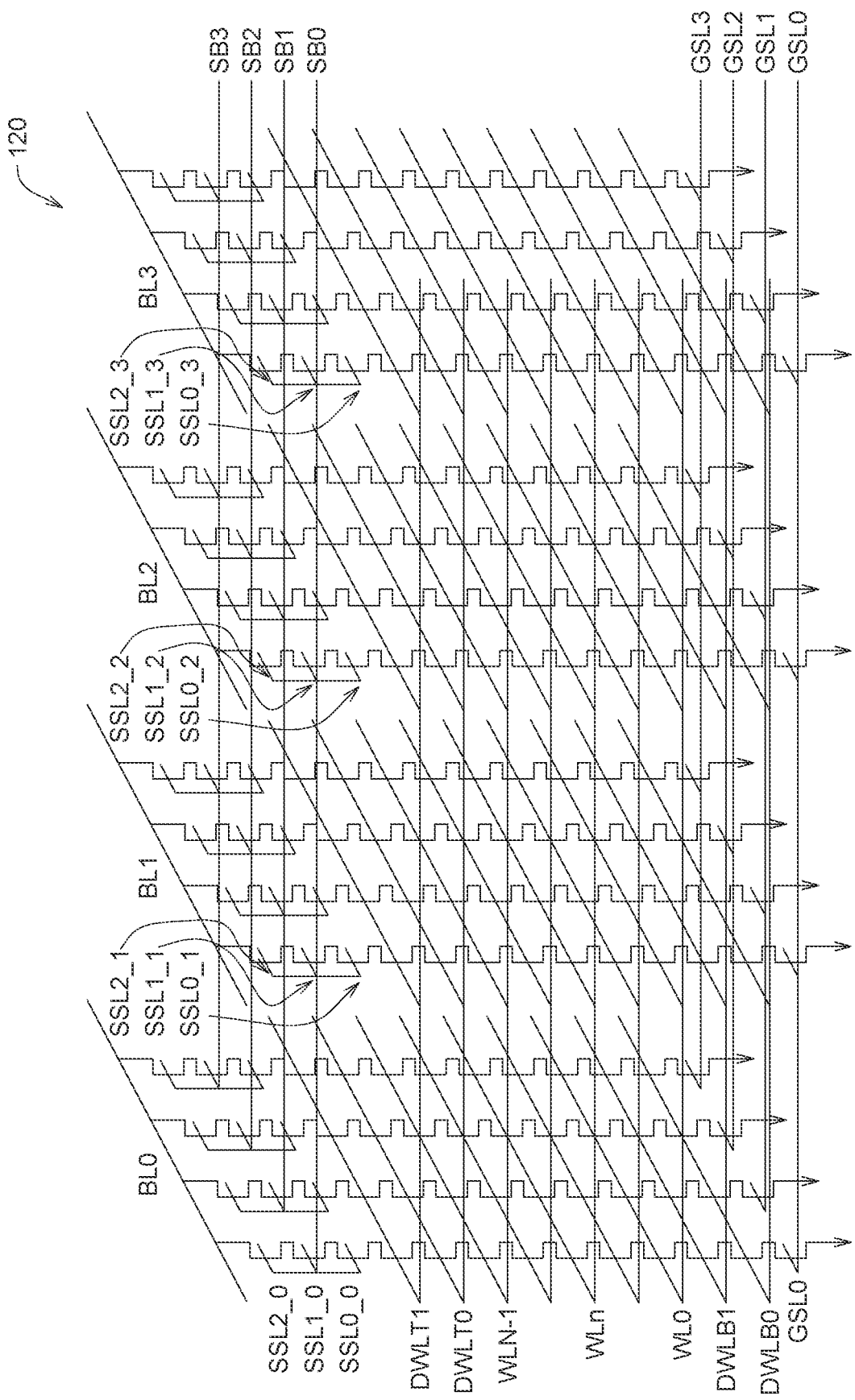
FIG. 2 shows a 3D circuit diagram of a memory array according to one embodiment of the application.

FIG. 2 shows a 3D circuit diagram of a memory array according to one embodiment of the application. The memory array 120 includes a plurality of string select lines (SSLs) SSL0_0~SSL2_3, a plurality of dummy word lines DWLT1, DWLT0, DWLB1 and DWLB0, a plurality of word lines WL0 to WLN−1 (N being a positive integer), a plurality of bit lines BL0 to BL3, a plurality of global select lines (GSLs) GSL0 to GSL3 and a plurality of memory cells. FIG. 2 is an example, and the application is not limited by this.

Usually, the memory array 120 includes a plurality of memory block each including for example but not limited by four sub-blocks. As shown in FIG. 2, the sub-blocks SB0 to SB3 are independently selected by the SSLs SSL0_0 to SSL2_3 and the GSLs GSL0 to GSL3.

Usually, the bias voltage condition of the word lines on the border may be different from the bias voltage condition of the word lines in the middle section. In one possible embodiment of the application, several dummy word lines DWLT1, DWLT0, DWLB1 and DWLB0 are located on sides of the word lines WL0~WLN−1. As shown in FIG. 2, the dummy word lines DWLB1 and DWLB0 are located on outer side of the word line WL0; and the dummy word lines DWLT1 and DWLT0 are located on outer side of the word line WLN−1. That is, the dummy word lines DWLB1 and DWLB0 are located between the word line WL0 and the global select lines GSL0~GSL3; and the dummy word lines DWLT1 and DWLT0 are located between the word line WLN−1 and the string select lines SSL0_0~SSL2_3. By so, the bias voltage condition of the word lines WL0~WLN−1 may be the same. The memory cells coupled to the word lines WL0~WLN−1 are used in data access. On the contrary, the dummy cells coupled to the dummy word lines DWLT1, DWLT0, DWLB1 and DWLB0 are not used in data access.

Still further, the voltages applied to the dummy word lines are independent from the voltages applied to the word lines WL0~WLN−1. Details of the voltages are as follows.

Also, the number and the location of the dummy word lines in FIG. 2 are for example, not to limit the application.

Figure 3:
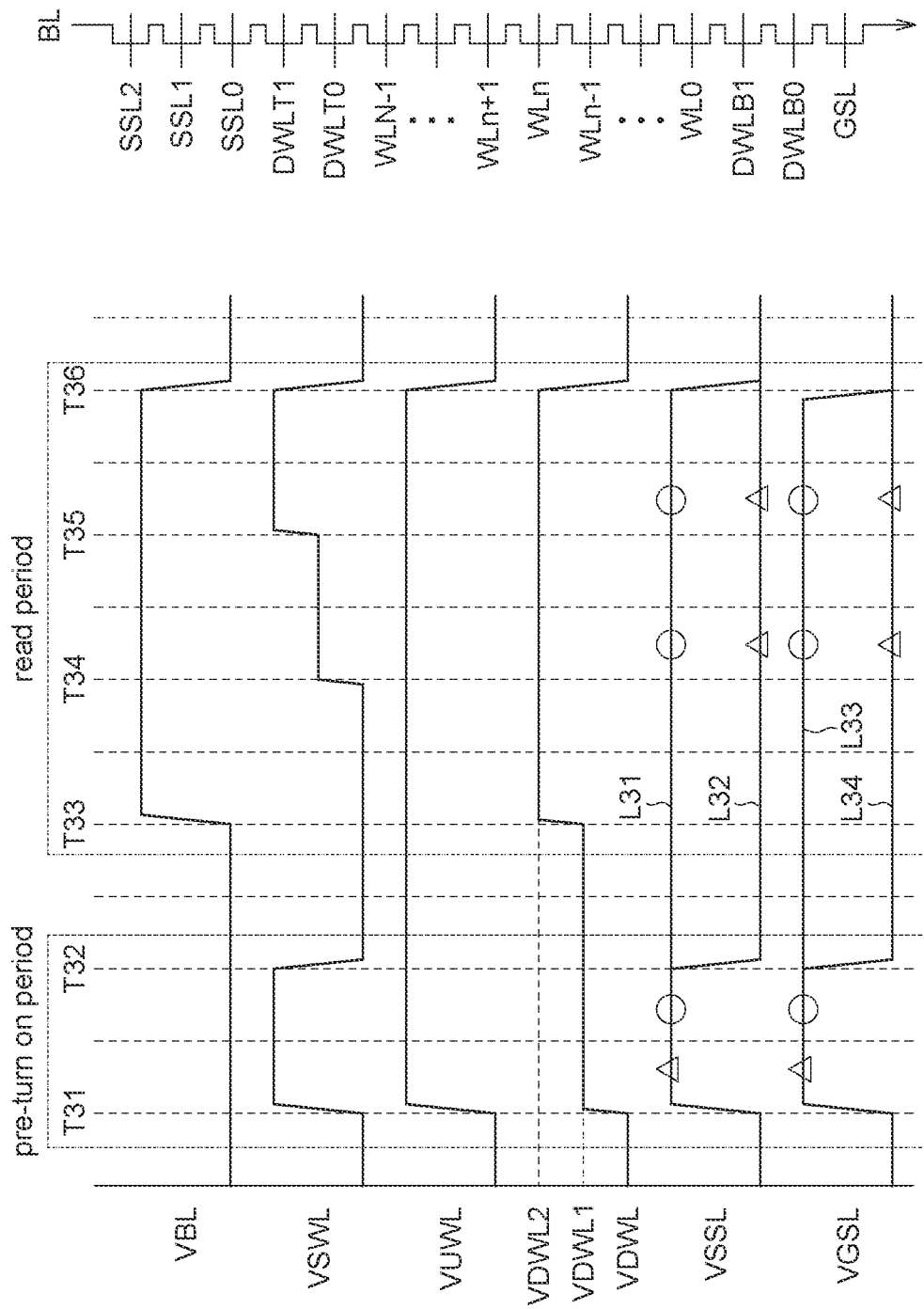
FIG. 3 shows a read operation waveform diagram of a memory device according to a first embodiment of the application.

FIG. 3 shows a read operation waveform diagram of a memory device according to a first embodiment of the application. VBL refers to the bit line voltage applied to the bit lines BL0~BL3, VSWL refers to the selected word line voltage applied to the selected word line(s) among the word lines WL0~WLN−1, VUWL refers to the unselected word line voltage applied to the unselected word line(s) among the word lines WL0~WLN−1, VDWL refers to the dummy word line voltage applied to the dummy word lines DWLT1, DWLT0, DWLB1, DWLB0, VSSL refers to the SSL voltage applied to the string select lines SSL0 0~SSL2_3 and VGSL refers to the GSL voltage applied to the global select lines GSL0~GSL3.

In the first embodiment of the application, during the pre-turn on period, the bit line voltage VBL is at the low voltage (for example but not limited by 0V). In the read period, the bit line voltage VBL is transited to the high voltage (T33). When the read period finishes (T36), the bit line voltage VBL is transited to the low voltage.

In the first embodiment of the application, during the pre-turn on period, the selected word line voltage VSWL is rising at the timing T31 and is lowering at the timing T32. During the read period, the selected word line voltage VSWL has two-step voltages, the first step voltage is increased at the timing T34 while the second step voltage is increased at the timing T35. When the read period is finished, the selected word line voltage VSWL is transited to the low voltage.

In the first embodiment of the application, during the pre-turn on period, the unselected word line voltage VUWL is rising at the timing T31. When the read period is finished, the unselected word line voltage VUWL is transited to the low voltage.

In the first embodiment of the application, during the pre-turn on period, the dummy word line voltage VDWL is rising to a first dummy word line voltage VDWL1 at the timing T31. During the read period, the dummy word line voltage VDWL is rising from the first dummy word line voltage VDWL1 to the second dummy word line voltage VDWL2 at the timing T33. When the read period is finished, the dummy word line voltage VDWL is transited to the low voltage. The first dummy word line voltage VDWL1 is lower than the second dummy word line voltage VDWL2.

In the first embodiment of the application, during the pre-turn on period, the dummy word line voltage VDWL is rising to the first dummy word line voltage VDWL1; and the vertical electronic field on the dummy word lines during the pre-turn on period is reduced.

In the first embodiment of the application, during the read period, the dummy word line voltage VDWL is rising from the first dummy word line voltage VDWL1 to the second dummy word line voltage VDWL2. Thus, the memory cell strings are strongly turned on to yield higher memory cell string currents.

In the first embodiment of the application, the first dummy word line voltage VDWL1 and the second dummy word line voltage VDWL2 are applied to all dummy word lines (for example, DWLT1, DWLT0, DWLB1 and DWLB0).

Alternatively, in the first embodiment of the application, the dummy word lines (for example, DWLT1, DWLT0, DWLB1 and DWLB0) are applied by different first dummy word line voltages VDWL1 and different second dummy word line voltages VDWL2.

Alternatively, in the first embodiment of the application, the first dummy word line voltage VDWL1 and the second dummy word line voltage VDWL2 are applied to at least one adjacent dummy word line (for example, DWLT1 and DWLB0) among the dummy word lines. Wherein the at least one adjacent dummy word line refers to the dummy word line adjacent to at least one select line (the string select line SSL0 and the global select line GSL).

In the first embodiment of the application, the first dummy word line voltage VDWL1 is for example but not limited by, higher than the threshold voltage of the memory cells of the dummy word lines. For example, the first dummy word line voltage VDWL1 is between 2V and 5V.

In the first embodiment of the application, the second dummy word line voltage VDWL2 is corresponding to the pass voltage Vpass. For example, the second dummy word line voltage VDWL2, which is a sufficient high pass voltage Vpass, is between 6V and 9V.

In the first embodiment of the application, during the pre-turn on period, the string select line voltage VSSL (labeled by "L31") of the selected sub-blocks and the string select line voltage VSSL (labeled by "L32") of the unselected sub-blocks are rising at the timing T31. When the pre-turn on period is finished, the string select line voltage VSSL (labeled by "L32") of the unselected sub-blocks is lowered at the timing T32. When the read period is finished, the string select line voltage VSSL (labeled by "L31") of the selected sub-blocks is lowered. During the read period, the string select line voltage VSSL (labeled by "L32") of the unselected sub-blocks is kept at the low voltage.

In the first embodiment of the application, during the pre-turn on period, the global select line voltage VGSL (labeled by "L33") of the selected sub-blocks and the global select line voltage VGSL (labeled by "L34") of the unselected sub-blocks are rising at the timing T31. When the pre-turn on period is finished, the global select line voltage VGSL (labeled by "L34") of the unselected sub-blocks is lowered at the timing T32. When the read period is finished, the global select line voltage VGSL (labeled by "L33") of the selected sub-blocks is lowered. During the read period, the global select line voltage VGSL (labeled by "L34") of the unselected sub-blocks is kept at the low voltage.

Figure 4:
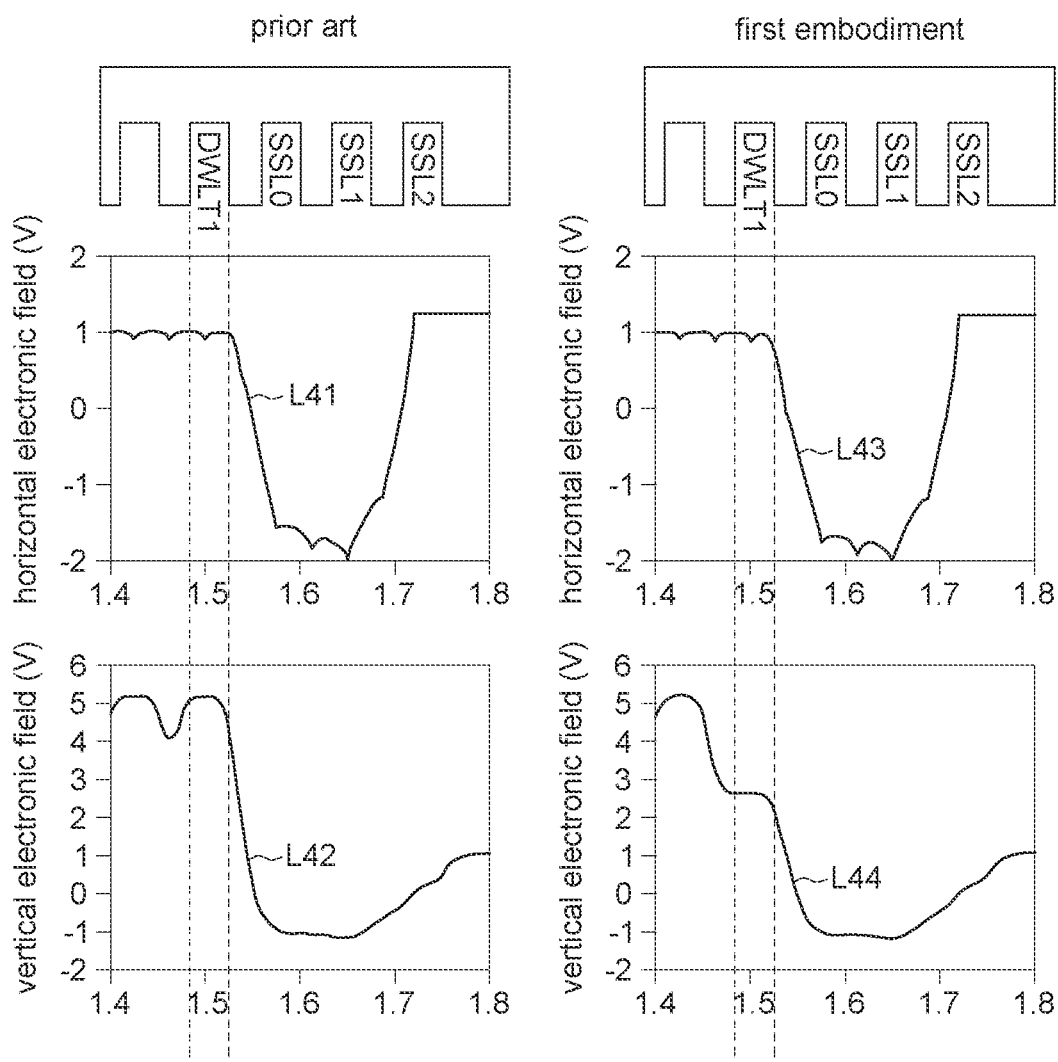
FIG. 4 shows comparison of the horizontal electronic field and the vertical electronic field in the prior art and in the first embodiment of the application.

FIG. 4 shows comparison of the horizontal electronic field and the vertical electronic field in the prior art and in the first embodiment of the application, wherein the horizontal axis refers a coordinate, which is corresponding to the above structure. The curve L41 refers to a horizontal electrical field between the channel and ONO (oxide-nitride-oxide) at the string select lines SSL2, SSL1, SSL0 and the dummy word line DWLT1 in the prior memory device (not applying the read operations of the first embodiment of the application) when the pre-turn on period is finished. The curve L42 refers to a vertical electrical field between ONO and the gate at the string select lines SSL2, SSL1, SSL0 and the dummy word line DWLT1 in the prior memory device (not applying the read operations of the first embodiment of the application) when the pre-turn on period is finished. The curve L43 refers to a horizontal electrical field between the channel and ONO at the string select lines SSL2, SSL1, SSL0 and the dummy word line DWLT1 in the first embodiment of the application when the pre-turn on period is finished. The curve L44 refers to a vertical electrical field between ONO and the gate at the string select lines SSL2, SSL1, SSL0 and the dummy word line DWLT1 in the first embodiment of the application when the pre-turn on period is finished.

By comparing the curves L42 and L44, the read operations of the first embodiment of the application may effectively reduce the vertical electronic field and further reduce the read disturbance.

Figure 5:
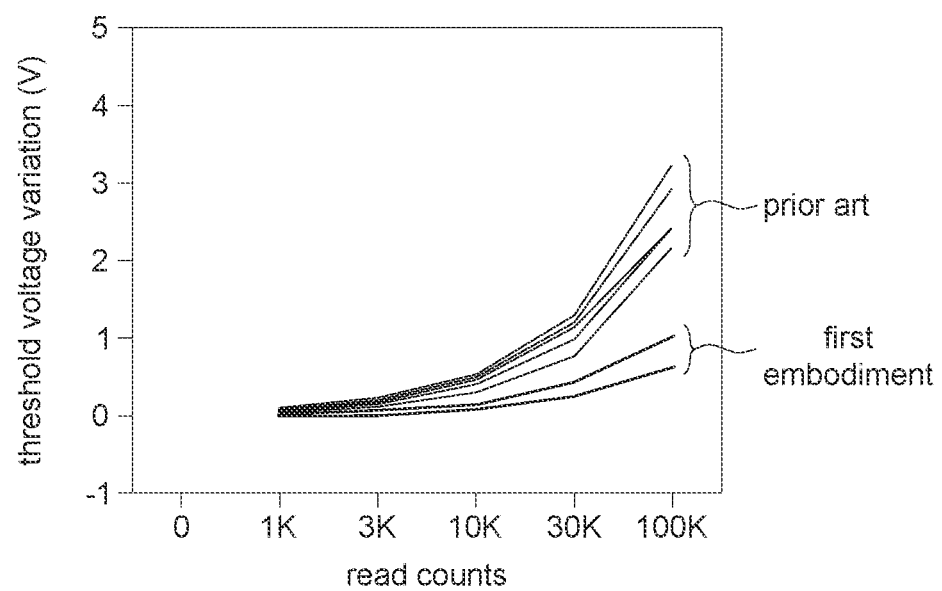
FIG. 5 shows a relationship curve of Vt (threshold voltage) variation to the read counts in the prior art and in the first embodiment of the application.

FIG. 5 shows a relationship curve of Vt (threshold voltage) variation to the read counts in the prior art and in the first embodiment of the application. As shown in FIG. 5, the first embodiment of the application may reduce the Vt (threshold voltage) variation and further reduce the read disturbance.

Figure 6:
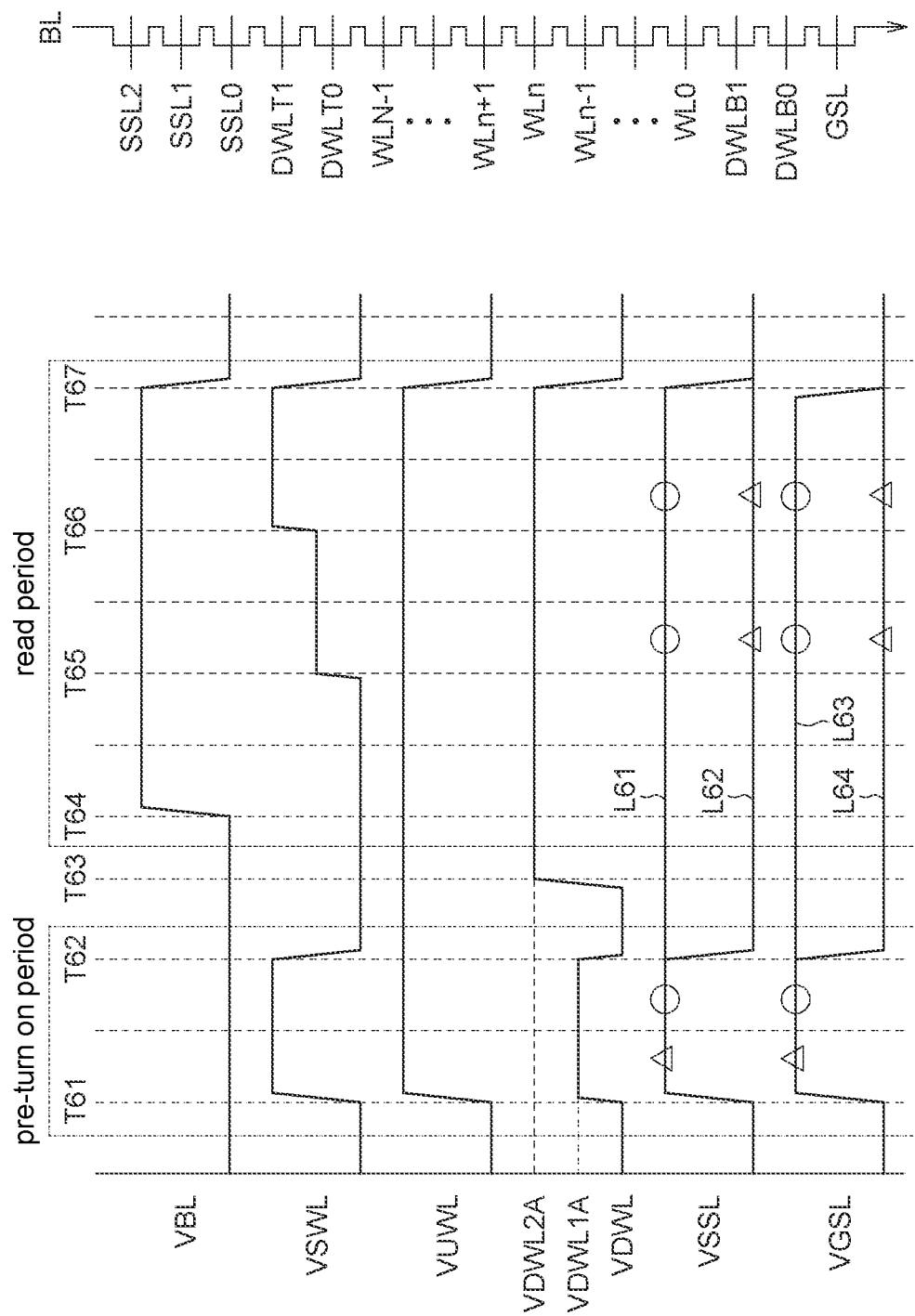
FIG. 6 shows a read operation waveform diagram of a memory device according to a second embodiment of the application.

FIG. 6 shows a read operation waveform diagram of a memory device according to a second embodiment of the application.

In the second embodiment of the application, during the pre-turn on period, the bit line voltage VBL is at the low voltage (for example but not limited by 0V). In the read period, the bit line voltage VBL is transited to the high voltage (T64). When the read period finishes (T67), the bit line voltage VBL is transited to the low voltage.

In the second embodiment of the application, during the pre-turn on period, the selected word line voltage VSWL is rising at the timing T61 and is lowering at the timing T62. During the read period, the selected word line voltage VSWL has two-step voltages, the first step voltage is increased at the timing T65 while the second step voltage is increased at the timing T66. When the read period is finished, the selected word line voltage VSWL is transited to the low voltage.

In the second embodiment of the application, during the pre-turn on period, the unselected word line voltage VUWL is rising at the timing T61. When the read period is finished, the unselected word line voltage VUWL is transited to the low voltage.

In the second embodiment of the application, during the pre-turn on period, the dummy word line voltage VDWL is rising to a first dummy word line voltage VDWL1A at the timing T61 and lowering at the timing T62. Then, the dummy word line voltage VDWL is rising to the second dummy word line voltage VDWL2A at the timing T63. When the read period is finished, the dummy word line voltage VDWL is transited to the low voltage. The first dummy word line voltage VDWL1A is lower than the second dummy word line voltage VDWL2A.

In the second embodiment of the application, the rising edge (i.e. the timing T63) when the dummy word line voltage VDWL is rising to the second dummy word line voltage VDWL2A is at least earlier than the rising edge (the timing T65) of the first step voltage of the selected word line voltage VSWL.

In the second embodiment of the application, during the pre-turn on period, the dummy word line voltage VDWL is lowered to the low voltage when the pre-turn on period is finished (at the timing T62), and thus the voltage difference between the select lines (the string select line SSL2 or the global select line GSL) and the adjacent dummy word lines (DWLT1 or DWLB0) is reduced. Besides, the voltage difference between the dummy word line DWLT0 and the word line N−1 is also reduced because the dummy word line DWLT0 is at the low voltage.

In the second embodiment of the application, when the dummy word line voltage VDWL is rising to the second dummy word line voltage VDWL2A at the timing T63, the down-coupling effect at the select lines (the string select line SSL2 or the global select line GSL) is reduced and thus also the read disturbance is reduced.

In the second embodiment of the application, the first dummy word line voltage VDWL1A and the second dummy word line voltage VDWL2A are applied to all dummy word lines (for example, DWLT1, DWLT0, DWLB1 and DWLB0).

Alternatively, in the second embodiment of the application, the dummy word lines (for example, DWLT1, DWLT0, DWLB1 and DWLB0) are applied by different first dummy word line voltages VDWL1A and different second dummy word line voltages VDWL2A.

Alternatively, in the second embodiment of the application, the first dummy word line voltage VDWL1A and the second dummy word line voltage VDWL2A are applied to at least one adjacent dummy word line (for example, DWLT1 and DWLB0) among the dummy word lines. Wherein the at least one adjacent dummy word line refers to the dummy word line adjacent to at least one select line (the string select line SSL0 and the global select line GSL).

In the second embodiment of the application, the first dummy word line voltage VDWL1A is for example but not limited by, higher than the threshold voltage of the memory cells of the dummy word lines. For example, the first dummy word line voltage VDWL1 is between 2V and 5V.

In the second embodiment of the application, the second dummy word line voltage VDWL2A is corresponding to the pass voltage Vpass. For example, the second dummy word line voltage VDWL2A, which is a sufficient high pass voltage Vpass, is between 6V and 9V.

In the second embodiment of the application, during the pre-turn on period, the string select line voltage VSSL (labeled by "L61") of the selected sub-blocks and the string select line voltage VSSL (labeled by "L62") of the unselected sub-blocks are rising at the timing T61. When the pre-turn on period is finished, the string select line voltage VSSL (labeled by "L62") of the unselected sub-blocks is lowered at the timing T62. When the read period is finished, the string select line voltage VSSL (labeled by "L61") of the selected sub-blocks is lowered. During the read period, the string select line voltage VSSL (labeled by "L62") of the unselected sub-blocks is kept at the low voltage.

In the second embodiment of the application, during the pre-turn on period, the global select line voltage VGSL (labeled by "L63") of the selected sub-blocks and the global select line voltage VGSL (labeled by "L64") of the unselected sub-blocks are rising at the timing T61. When the pre-turn on period is finished, the global select line voltage VGSL (labeled by "L64") of the unselected sub-blocks is lowered at the timing T62. When the read period is finished, the global select line voltage VGSL (labeled by "L63") of the selected sub-blocks is lowered. During the read period, the global select line voltage VGSL (labeled by "L64") of the unselected sub-blocks is kept at the low voltage.

Figure 7:
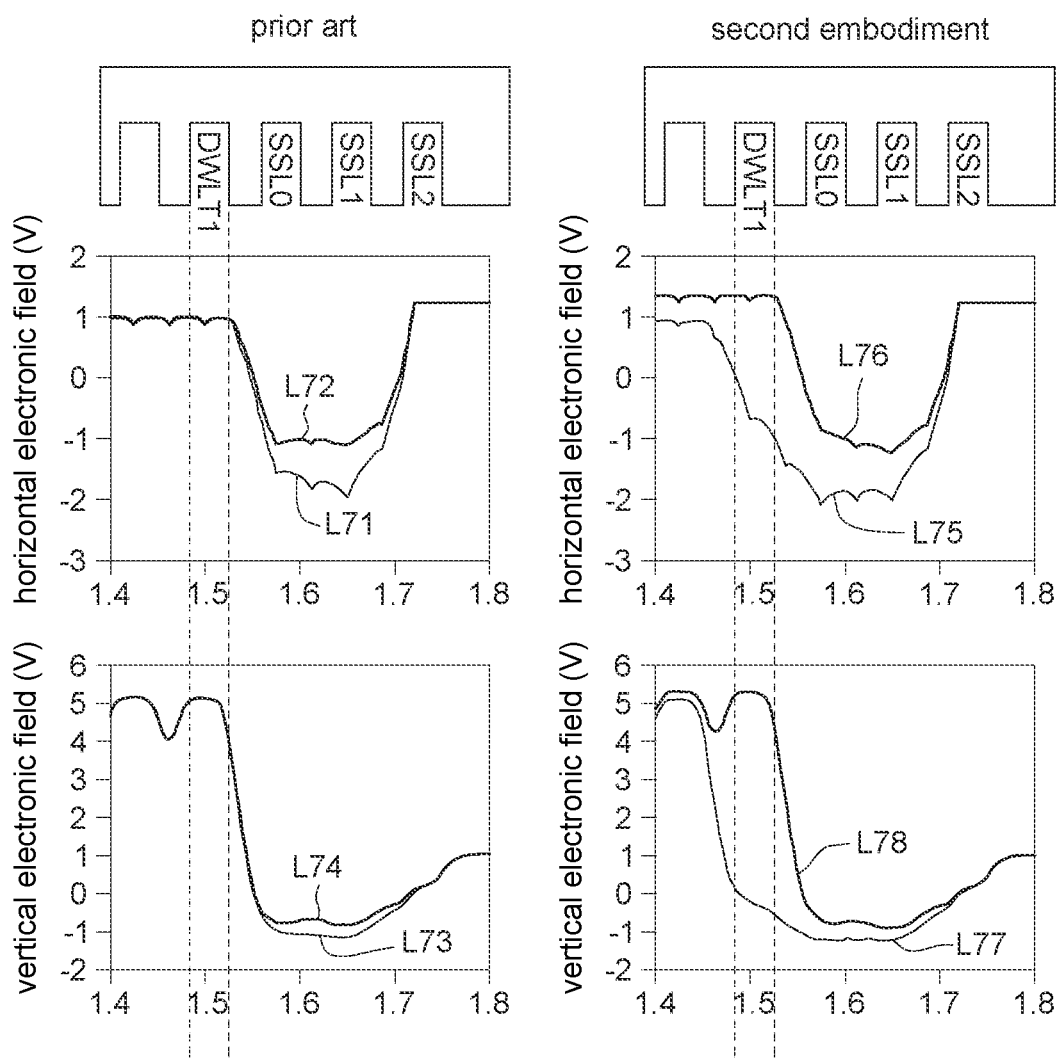
FIG. 7 shows comparison of the horizontal electronic field and the vertical electronic field in the prior art and in the second embodiment of the application.

FIG. 7 shows comparison of the horizontal electronic field and the vertical electronic field in the prior art and in the second embodiment of the application. The curve L71 refers to a horizontal electrical field between the channel and ONO at the string select lines SSL2, SSL1, SSL0 and the dummy word line DWLT1 in the prior memory device (not applying the read operations of the second embodiment of the application) when the pre-turn on period is finished. The curve L72 refers to a horizontal electrical field between the channel and ONO at the string select lines SSL2, SSL1, SSL0 and the dummy word line DWLT1 in the prior memory device (not applying the read operations of the second embodiment of the application) at the timing T63. The curve L73 refers to a vertical electrical field between ONO and the gate at the string select lines SSL2, SSL1, SSL0 and the dummy word line DWLT1 in the prior memory device (not applying the read operations of the second embodiment of the application) when the pre-turn on period is finished. The curve L74 refers to a vertical electrical field between ONO and the gate at the string select lines SSL2, SSL1, SSL0 and the dummy word line DWLT1 in the prior memory device (not applying the read operations of the second embodiment of the application) at the timing T63. The curve L75 refers to a horizontal electrical field between the channel and ONO at the string select lines SSL2, SSL1, SSL0 and the dummy word line DWLT1 in the second embodiment of the application when the pre-turn on period is finished. The curve L76 refers to a horizontal electrical field between the channel and ONO at the string select lines SSL2, SSL1, SSL0 and the dummy word line DWLT1 in the second embodiment of the application at the timing T63. The curve L77 refers to a vertical electrical field between ONO and the gate at the string select lines SSL2, SSL1, SSL0 and the dummy word line DWLT1 in the second embodiment of the application when the pre-turn on period is finished. The curve L78 refers to a vertical electrical field between ONO and the gate at the string select lines SSL2, SSL1, SSL0 and the dummy word line DWLT1 in the second embodiment of the application at the timing T63.

By comparing the curves L71 and L75, the read operations of the second embodiment of the application may effectively reduce the voltage difference between the string select line SSL0 and the dummy word line DWLT1. By comparing the curves L73 and L77, the read operations of the second embodiment of the application may effectively reduce the vertical electronic field at the dummy word line DWLT1.

At the timing T63, from the curve L76, the down-coupling effect is effectively reduced and thus the read disturbance is also reduced in one embodiment of the application.

Figure 8:
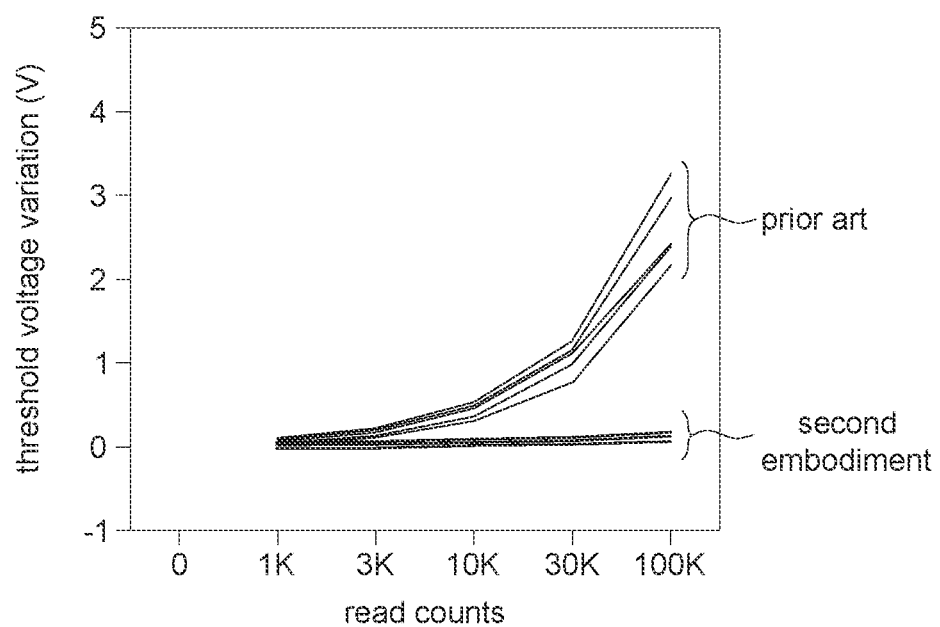
FIG. 8 shows a relationship curve of Vt (threshold voltage) variation to the read counts in the prior art and in the second embodiment of the application.

FIG. 8 shows a relationship curve of Vt (threshold voltage) variation to the read counts in the prior art and in the second embodiment of the application. As shown in FIG. 8, the second embodiment of the application may reduce the Vt (threshold voltage) variation and further reduce the read disturbance.

Figure 9:
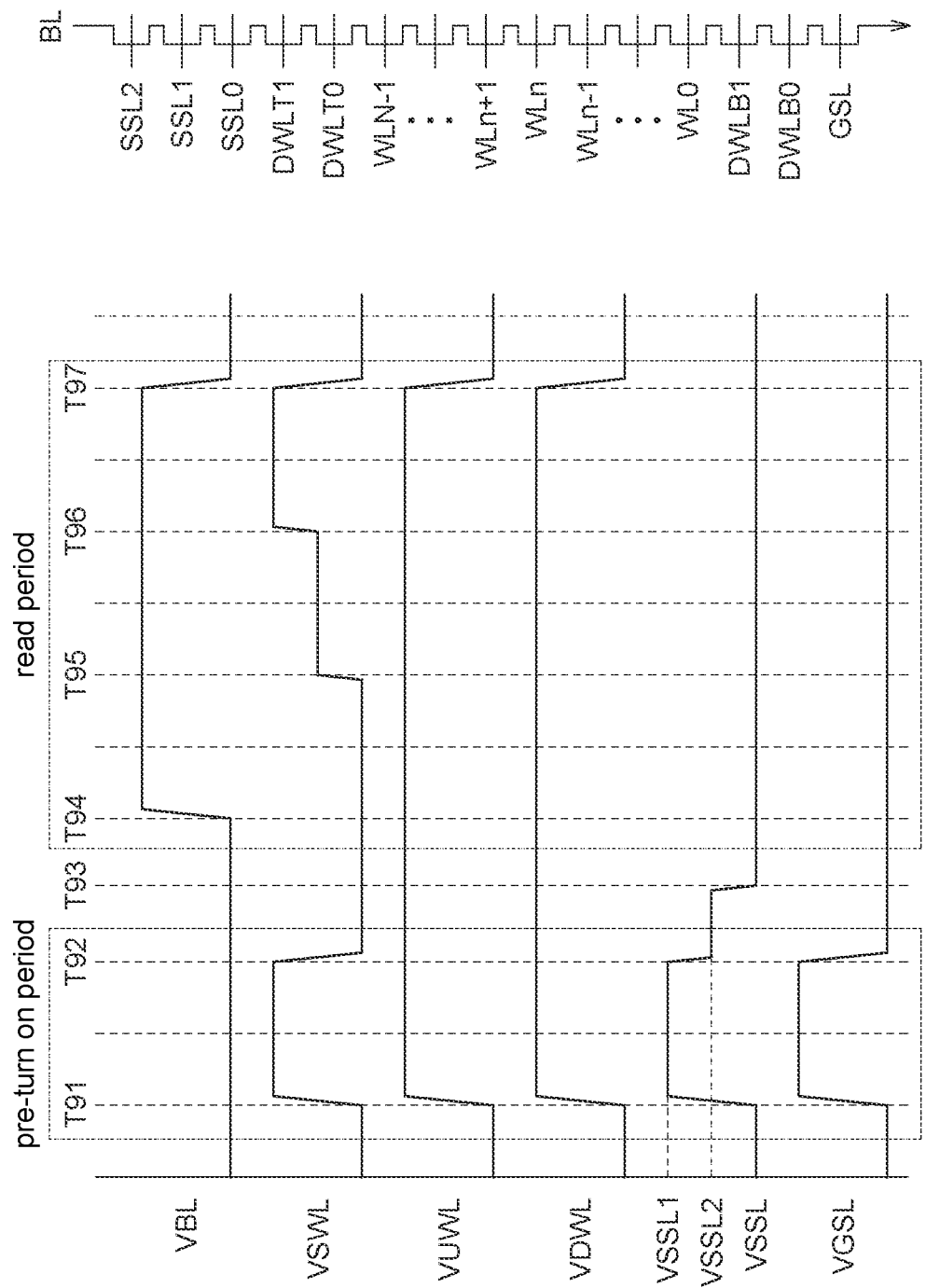
FIG. 9 shows a read operation waveform diagram of a memory device according to a third embodiment of the application.

FIG. 9 shows a read operation waveform diagram of a memory device according to a third embodiment of the application.

In the third embodiment of the application, during the pre-turn on period, the bit line voltage VBL is at the low voltage (for example but not limited by 0V). In the read period, the bit line voltage VBL is transited to the high voltage (T94). When the read period finishes (T97), the bit line voltage VBL is transited to the low voltage.

In the third embodiment of the application, during the pre-turn on period, the selected word line voltage VSWL is rising at the timing T91 and is lowering at the timing T92. During the read period, the selected word line voltage VSWL has two-step voltages, the first step voltage is increased at the timing T95 while the second step voltage is increased at the timing T96. When the read period is finished, the selected word line voltage VSWL is transited to the low voltage.

In the third embodiment of the application, during the pre-turn on period, the unselected word line voltage VUWL is rising at the timing T91. When the read period is finished, the unselected word line voltage VUWL is transited to the low voltage.

In the third embodiment of the application, during the pre-turn on period, the dummy word line voltage VDWL is rising at the timing T91. When the read period is finished, the dummy word line voltage VDWL is transited to the low voltage.

In the third embodiment of the application, during the pre-turn on period, the string select line voltage VSSL of the unselected sub-blocks is rising to the first string select line voltage VSSL1 at the timing T91. When the pre-turn on period is finished, the string select line voltage VSSL of the unselected sub-blocks is lowered at the timing T92 in two steps. In details, at timing T92, the string select line voltage VSSL of the unselected sub-blocks is lowered from the first string select line voltage VSSL1 to the second string select line voltage VSSL2, wherein the first string select line voltage VSSL1 is higher than the second string select line voltage VSSL2. The string select line voltage VSSL of the unselected sub-blocks is lowered from the second string select line voltage VSSL2 to the low voltage at timing T93. In the third embodiment of the application, waveforms of the string select line voltage VSSL of the selected sub-blocks are the same or similar to the waveforms of the string select line voltage VSSL of the selected sub-blocks in FIG. 6 of the second embodiment of the application, and details thereof are omitted.

In the third embodiment of the application, the string select lines SSL2 to SSL0 are applied by the same string select voltage SSL in FIG. 9.

In the third embodiment of the application, the first string select line voltage VSSL1 is for example but not limited by, higher than the threshold voltage of the memory cells of the string select lines SSL2 to SSL0. For example, if the threshold voltage of the memory cells of the string select lines SSL2 to SSL0 is 3V, then the first string select line voltage VSSL1 is between 5V and 8V.

In the third embodiment of the application, the second string select line voltage VSSL2 is for example but not limited by, slightly lower than the threshold voltage of the memory cells of the string select lines SSL2 to SSL0. For example, the second string select line voltage VSSL2 is for example but not limited by, one-half of the threshold voltage of the memory cells of the string select lines SSL2 to SSL0. For example, if the threshold voltage of the memory cells of the string select lines SSL2 to SSL0 is 3V, then the second string select line voltage VSSL2 is for example but not limited by, between 1V and 2V, or between 2V and 3V.

In the third embodiment of the application, during the pre-turn on period, the global select line voltage VGSL of the unselected sub-blocks is rising at the timing T91. When the pre-turn on period is finished, the global select line voltage VGSL of the unselected sub-blocks is lowered to the low voltage. In the third embodiment of the application, waveforms of the global select line voltage VGSL of the selected sub-blocks are the same or similar to the waveforms of the global select line voltage VGSL of the selected sub-blocks in FIG. 6 of the second embodiment of the application, and details thereof are omitted.

Figure 10:
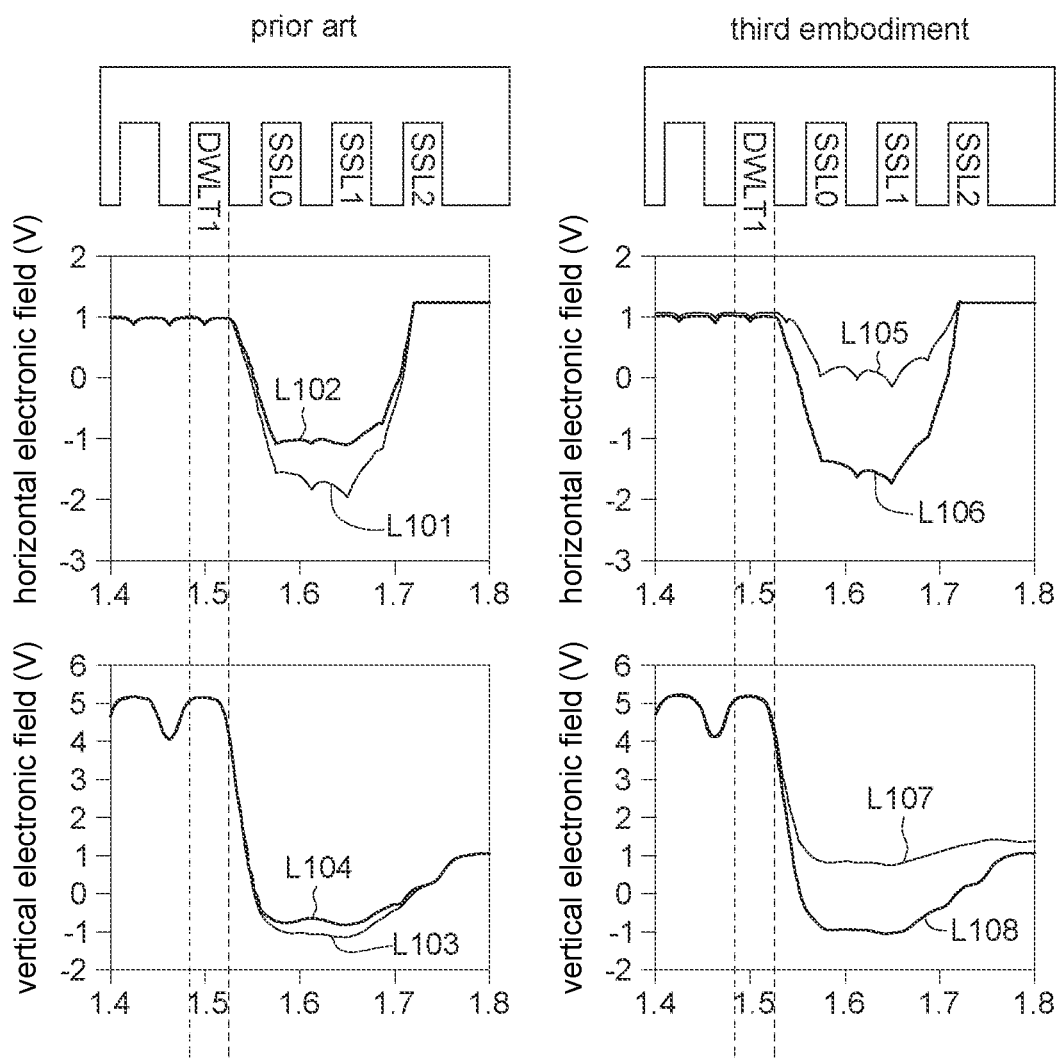
FIG. 10 shows comparison of the horizontal electronic field and the vertical electronic field in the prior art and in the third embodiment of the application.

FIG. 10 shows comparison of the horizontal electronic field and the vertical electronic field in the prior art and in the second embodiment of the application. The curve L101 refers to a horizontal electrical field between the channel and ONO at the string select lines SSL2, SSL1, SSL0 and the dummy word line DWLT1 in the prior memory device (not applying the read operations of the third embodiment of the application) when the pre-turn on period is finished. The curve L102 refers to a horizontal electrical field between the channel and ONO at the string select lines SSL2, SSL1, SSL0 and the dummy word line DWLT1 in the prior memory device (not applying the read operations of the third embodiment of the application) at the timing T93. The curve L103 refers to a vertical electrical field between ONO and the gate at the string select lines SSL2, SSL1, SSL0 and the dummy word line DWLT1 in the prior memory device (not applying the read operations of the third embodiment of the application) when the pre-turn on period is finished. The curve L104 refers to a vertical electrical field between ONO and the gate at the string select lines SSL2, SSL1, SSL0 and the dummy word line DWLT1 in the prior memory device (not applying the read operations of the third embodiment of the application) at the timing T93. The curve L105 refers to a horizontal electrical field between the channel and ONO at the string select lines SSL2, SSL1, SSL0 and the dummy word line DWLT1 in the third embodiment of the application when the pre-turn on period is finished. The curve L106 refers to a horizontal electrical field between the channel and ONO at the string select lines SSL2, SSL1, SSL0 and the dummy word line DWLT1 in the third embodiment of the application at the timing T93. The curve L107 refers to a vertical electrical field between ONO and the gate at the string select lines SSL2, SSL1, SSL0 and the dummy word line DWLT1 in the third embodiment of the application when the pre-turn on period is finished. The curve L108 refers to a vertical electrical field between ONO and the gate at the string select lines SSL2, SSL1, SSL0 and the dummy word line DWLT1 in the third embodiment of the application at the timing T93.

By comparing the curves L101 and L105, the read operations of the third embodiment of the application may effectively reduce the down-coupling effect at the string select lines SSL2 to SSL0. Similarly, By comparing the curves L103 and L107, the read operations of the third embodiment of the application may effectively reduce the down-coupling effect at the string select lines SSL2 to SSL0.

Even the curves L106 and L101 have similar horizontal field, the read operations of the third embodiment of the application may effectively reduce the effective stress time. Thus, the read operations of the third embodiment of the application may effectively reduce read disturbance.

Figure 11:
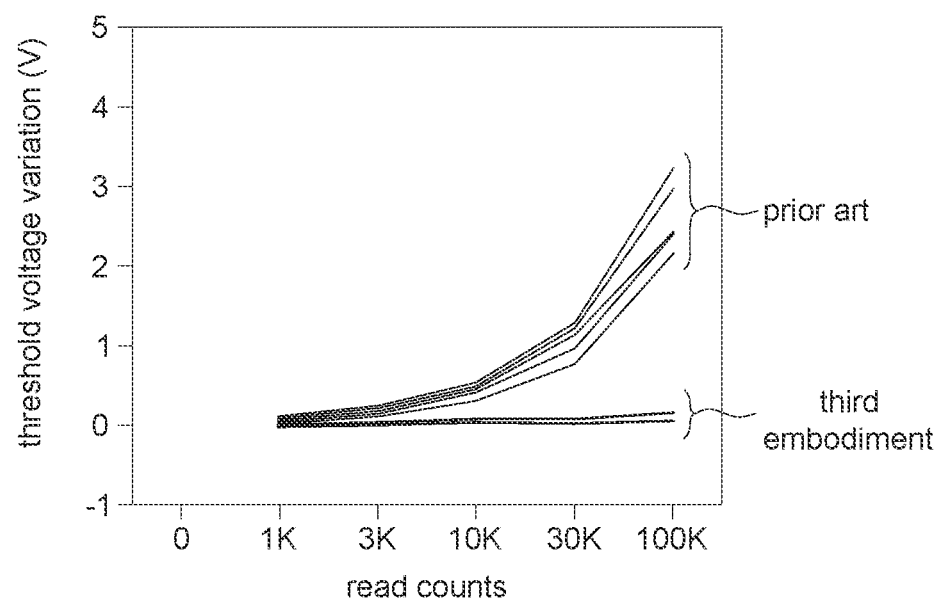
FIG. 11 shows a relationship curve of Vt (threshold voltage) variation to the read counts in the prior art and in the third embodiment of the application.

FIG. 11 shows a relationship curve of Vt (threshold voltage) variation to the read counts in the prior art and in the third embodiment of the application. As shown in FIG. 11, the third embodiment of the application may reduce the Vt (threshold voltage) variation and further reduce the read disturbance.

The first embodiment, the second embodiment and the third embodiment may be independently implemented or may be implemented in combination. For example, the first embodiment and the third embodiment may be implemented in combination. Alternatively, the second embodiment and the third embodiment may be implemented in combination. These are within the spirit and the scope of the application.

From the above description, the above embodiments of the application may effectively reduce abnormal read disturbance on dummy word lines.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device, the operation method including:
   increasing a dummy word line voltage to a first dummy word line voltage during a pre-turn on period and lowering the dummy word line voltage when the pre-turn on period is finished;
   increasing the dummy word line voltage to a second dummy word line voltage; and
   lowering the dummy word line voltage after a read period is finished,
   wherein the first dummy word line voltage is lower than the second dummy word line voltage; and
   a rising edge where the dummy word line voltage is increased to the second dummy word line voltage is earlier than a rising edge of a selected word line voltage.

2. The operation method according to claim 1, wherein the first dummy word line voltage and the second dummy word line voltage are applied to each of a plurality of dummy word lines of the memory device, and the dummy word lines are on adjacent sides of a plurality of word lines of the memory device.

3. The operation method according to claim 1, wherein a plurality of dummy word lines of the memory device are applied by different first dummy word line voltages and different second dummy word line voltages.

4. The operation method according to claim 1, wherein the first dummy word line voltage and the second dummy word line voltage are applied to at least one adjacent dummy word line among a plurality of dummy word lines of the memory device, the at least one adjacent dummy word line is adjacent to at least one select line.

5. The operation method according to claim 1, wherein the first dummy word line voltage is higher than a threshold voltage of a plurality of memory cells on a plurality of dummy word lines of the memory device.

6. The operation method according to claim 1, wherein the second dummy word line voltage is corresponding to a pass voltage.

7. The operation method according to claim 1, further including increasing a string select line voltage of at least one unselected sub-block to a first string select line voltage during the pre-turn on period;
   lowering the string select line voltage of the at least one unselected sub-block from the first string select line voltage to a second string select line voltage when the pre-turn on period is finished, the first string select line voltage is higher than the second string select line voltage; and lowering the string select line voltage of the at least one unselected sub-block from the second string select line voltage.

8. The operation method according to claim 7, wherein the string select line voltage is applied to a plurality of string select lines of the memory device;

the first string select line voltage is higher than a threshold voltage of a plurality of memory cells on the plurality of string select lines of the memory device; and the second string select line voltage is lower than the threshold voltage of the plurality of memory cells on the plurality of string select lines of the memory device.

\* \* \* \* \*